(12) United States Patent
Cheng (10) Patent No.: US 9,111,940 B2
(45) Date of Patent: Aug. 18, 2015

(54) REPAIRING METHOD, REPAIRING STRUCTURE, AND REPAIRING SYSTEM FOR DISCONNECTED DEFECT

(71) Applicant: SHENZHEN CHINA STAR OPTOELECTRONICS TECHNOLOGY CO., LTD., Shenzhen, Guangdong (CN)

(72) Inventor: Wen-Da Cheng, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 278 days.

(21) Appl. No.: 13/810,511

(22) PCT Filed: Dec. 10, 2012

(86) PCT No.: PCT/CN2012/086295
§ 371 (c)(1),
(2) Date: Jan. 16, 2013

(87) PCT Pub. No.: WO2014/086050
PCT Pub. Date: Jun. 12, 2014

(65) Prior Publication Data
US 2014/0151903 A1 Jun. 5, 2014

(51) Int. Cl.
*H01L 21/768* (2006.01)
*H01L 23/535* (2006.01)
*H01L 23/522* (2006.01)

(52) U.S. Cl.
CPC ........ *H01L 23/535* (2013.01); *H01L 21/76892* (2013.01); *H01L 23/5221* (2013.01); *H01L 2924/0002* (2013.01)

(58) Field of Classification Search
CPC .................. H01L 23/535; H01L 21/76892
USPC .................. 257/59, 72, 776; 438/4; 156/345.1
See application file for complete search history.

(56) References Cited

U.S. PATENT DOCUMENTS

| | | | |
|---|---|---|---|
| 7,265,386 B2* | 9/2007 | Chen et al. ...................... | 257/59 |
| 2001/0035920 A1 | 11/2001 | Choi | |
| 2008/0067518 A1* | 3/2008 | Tsou ................................ | 257/71 |
| 2008/0116501 A1* | 5/2008 | Lin et al. ......................... | 257/315 |
| 2008/0217687 A1* | 9/2008 | Tsou ............................... | 257/347 |

FOREIGN PATENT DOCUMENTS

| | | | |
|---|---|---|---|
| CN | 1435874 A | * | 8/2003 |
| CN | 101144946 A | | 3/2008 |

(Continued)

OTHER PUBLICATIONS

Machine translation of JP 09045683 A.*

*Primary Examiner* — Anthony Ho
*Assistant Examiner* — Samuel Lair (57) ABSTRACT

The present disclosure provides a repairing method, a repairing structure and a repairing system for a disconnected defect, the repairing method includes: forming a first repairing line connecting two ends of a disconnected portion of a scanning line; forming an insulation layer covering the first repairing line; and forming a second repairing line connecting two ends of a disconnected portion of a data line with the insulation layer located at an intersection of the first repairing line and the second repairing line. By forming the insulation layer between the first repairing line and the second repairing line, the present disclosure avoids the short circuit generated after the scanning line and the data line are repaired, repairs the disconnected defect at the intersection of two metal layers, improves the yield rate of the repairing of the disconnected defect, and reduces manufacturing cost.

11 Claims, 5 Drawing Sheets

(56) References Cited

FOREIGN PATENT DOCUMENTS

| | | |
|---|---|---|
| CN | 101431019 A | 5/2009 |
| CN | 101809503 A | 8/2010 |
| CN | 102087426 A | 6/2011 |
| CN | 102368478 A | 3/2012 |
| JP | 09045683 A * | 2/1997 |
| JP | H0945683 A | 2/1997 |
| JP | 2000241833 A | 9/2000 |

* cited by examiner

REPAIRING METHOD, REPAIRING STRUCTURE, AND REPAIRING SYSTEM FOR DISCONNECTED DEFECT

BACKGROUND

1. Technical Field

The present disclosure relates to liquid crystal displaying technologies, and particularly, to a repairing method, a repairing structure, and a repairing system for a disconnected defect of a liquid crystal panel.

2. Description of Related Art

Due to advantages including small size, light weight, excellent image quality, low power consumption, low service life, digitalization, and no radiation, TFT-LCD (Thin Film Transistor Liquid Crystal Display) has be commonly used in different kinds of large, medium, and small size of products, which almost cover all the main electronic products in the present information society such as televisions, computers, mobile phones, GPS (Global positioning system), vehicle displays, and public displays.

Figure 1A:
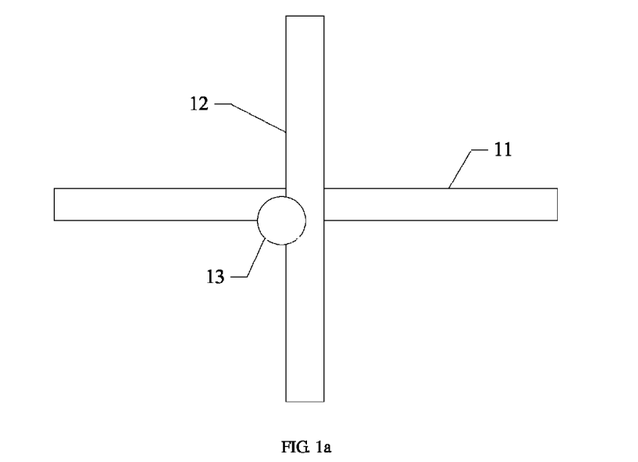
FIG. 1a is a schematic view showing an impurity at an intersection of a scanning line and a data line in the conventional art.
Figure 1B:
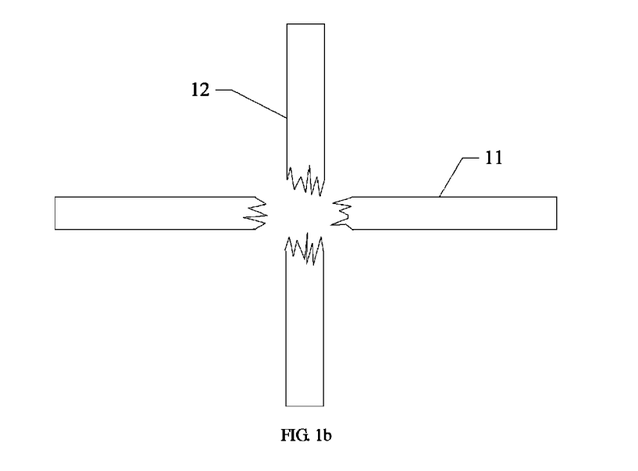
FIG. 1b is a schematic view of the scanning line and the data line after the impurity is removed by laser.
Figure 1C:
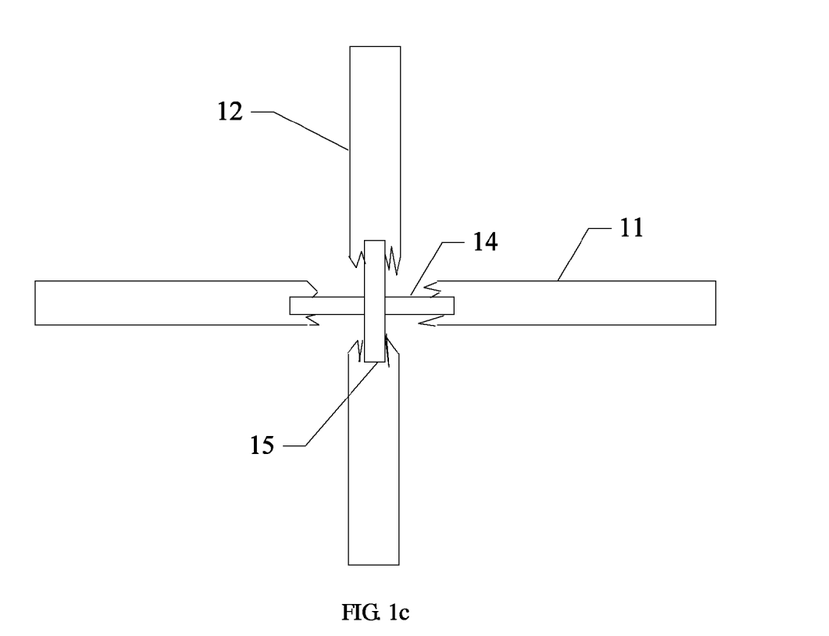
FIG. 1c is a schematic view showing a short circuit caused by repairing the intersection of the scanning line and the data line by coated lines.

TFT-LCD is the combination of the technologies of semiconductors and technologies of liquid crystal displaying, and the manufacture of a TFT array is the hardest part of the manufacture of the whole TFT-LCD. In the manufacturing process of the TFT array, scanning lines, an insulation layer, a semiconductor layer, data lines, and a transparent electrode layer are formed. In the manufacturing process of the TFT array, as shown in FIGS. 1a to 1c, after a data line 12 is formed, an impurity 13 may be remained at the intersection of a scanning line 11 and the data line (as shown in FIG. 1a). The impurity 13 needs to be removed. Generally, the impurity 13 can be removed when being exposed to laser. However, when exposing the impurity 13 to laser, other positions such as the scanning line 11 and the data line 12 may be also exposed to laser. Since the impurity 13 is located at the intersection of the scanning line 11 and the data line 12, therefore, when removing the impurity by exposing the impurity 13 to laser, the scanning line 11 and the data line 12 (as shown in FIG. 1b) are inevitably disconnected by laser. At the same time, there are other factors may disconnect the scanning line 11 and the data line 12 at the intersection thereof.

In order to improve the displaying effect of the TFT-LCD, the disconnected defect at the intersection of the scanning line 11 and the data line 12 are repaired. If the intersection of the scanning line 11 and the data line 12 is repaired by lines coatings directly, a repairing line 14 of the scanning line 11 may directly contact a repairing line 15 of the data line 12, which results in a short circuit between the scanning line 11 and the data line 12 (as shown in FIG. 1c) and further affects the displaying of a pixel area corresponding to the scanning line 11 and the data line 12. Therefore, at present, the disconnected defect at the intersection of the scanning line 11 and the data line 12 is often repaired after the TFT array is manufactured. However, the repairing after the TFT array is manufactured is relatively complicated, and the disconnected defect at the intersection of the scanning line 11 and the data line 12 cannot be repaired after the manufacturing process of the data line 12.

Therefore, how to repair the disconnected defect at the intersection of the scanning line 11 and the data line 12 has become a problem needed to be solved urgently in the manufacturing process of the TFT array.

SUMMARY

The present disclosure provides a repairing method, a repairing structure, and a repairing system for a disconnected defect for improving the yield rate of the repairing of the disconnected defect.

The repairing method for a disconnected defect provided in the present disclosure includes:

forming a first repairing line connecting two ends of a disconnected portion of a scanning line;

forming an insulation layer covering the first repairing line; and forming a second repairing line connecting two ends of a disconnected portion of a data line with the insulation layer located at an intersection of the scanning line and the data line.

Preferably, the step of forming an insulation layer covering the first repairing line includes:

forming the insulation layer partly covering the first repairing line.

Preferably, the step of forming an insulation layer covering the first repairing line includes:

presetting a position at which the second repairing line is formed;

determining a position of an intersection of the first repairing line and the second repairing line according to the preset position at which the second repairing line is formed; and forming an insulation layer at the intersection of the first repairing line and the second repairing line with the insulation layer covering the intersection.

Preferably, the step of forming an insulation layer covering the first repairing line includes:

coating an insulation film;

performing a photoresist-coating process, an exposing process, a developing process, an etching process, and a photo-stripping process to the insulation film to form the insulation layer.

Preferably, the repairing method further includes the following step after the step of forming an insulation layer covering the first repairing line:

curing the insulation layer.

Preferably, the step of curing the insulation layer comprises:

baking the insulation layer or exposing the insulation layer to ultraviolet light.

Preferably, the step of forming an insulation layer covering the first repairing line includes:

forming the insulation layer covering the whole first repairing line.

The present disclosure further provides a repairing structure for a disconnected defect located at an intersection of a scanning line and a data line of a TFT array substrate, including:

a first repairing line connecting two ends of a disconnected portion of a scanning line;

a second repairing line connecting two ends of a disconnected portion of a data line; and an insulation layer arranged at an intersection of the first repairing line and the second repairing line.

Preferably, the insulation layer covers the whole first repairing line.

Preferably, the insulation layer partly covers the first repairing line.

The present disclosure further yet provides a repairing system for a disconnected defect, including:

a coating device for forming a first repairing line connecting two ends of a disconnected portion of a scanning line and a second repairing line connecting two ends of a disconnected portion of a data line; and an insulation layer forming device for forming an insulation layer for covering the first repairing line.

Preferably, the insulation layer forming device includes:

a coating positioning module for presetting a position at which the second repairing line is formed and determining a position of an intersection of the first repairing line and the second repairing line according to the preset position at which the second repairing line is formed; and a coating module for forming the insulation layer at the position of the intersection of the first repairing line and the second repairing line with the insulation layer covering the intersection.

Preferably, the coating module includes:

a coating unit for coating an insulation film; and a forming unit for performing a photoresist-coating process, an exposing process, a developing process, an etching process, and a photoresist-stripping process to the insulation film to form the insulation layer.

Preferably, the coating module further includes a curing unit for curing the insulation layer.

Preferably, the curing unit is a baker or an ultraviolet irradiator.

Preferably, the insulation layer forming device is used for forming the insulation layer partly covering the first repairing line.

Preferably, the insulation layer is used for forming the insulation layer covering the whole first repairing line.

By forming an insulation layer between the first repairing line and the second repairing line, the present disclosure avoids the short circuit at the intersection of the scanning line and the data line effectively, repairs the disconnected defect at the intersection of two metal layers, and further improves the yield rate of the repairing of the disconnected defect.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 2:
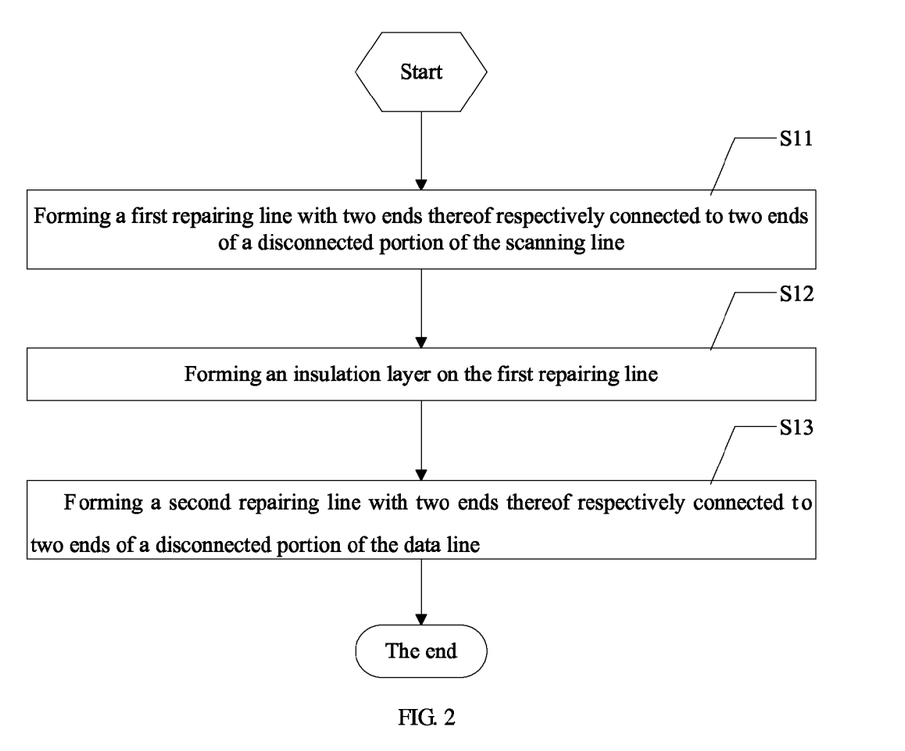
FIG. 2 is a flow chart of a repairing method for a disconnected defect in accordance with an embodiment of the present disclosure.

Referring to FIG. 2, which is a flow chart of a repairing method for a disconnected defect in accordance with an embodiment of the present disclosure. In the embodiment, the repairing method for the disconnected defect is used for repairing disconnected defect at an intersection of a scanning line and a data line on a TFT array substrate. The repairing method for the disconnected defect includes the following steps.

Step S11, forming a first repairing line with two ends thereof respectively connected to two ends of a disconnected portion of the scanning line.

Figure 4:
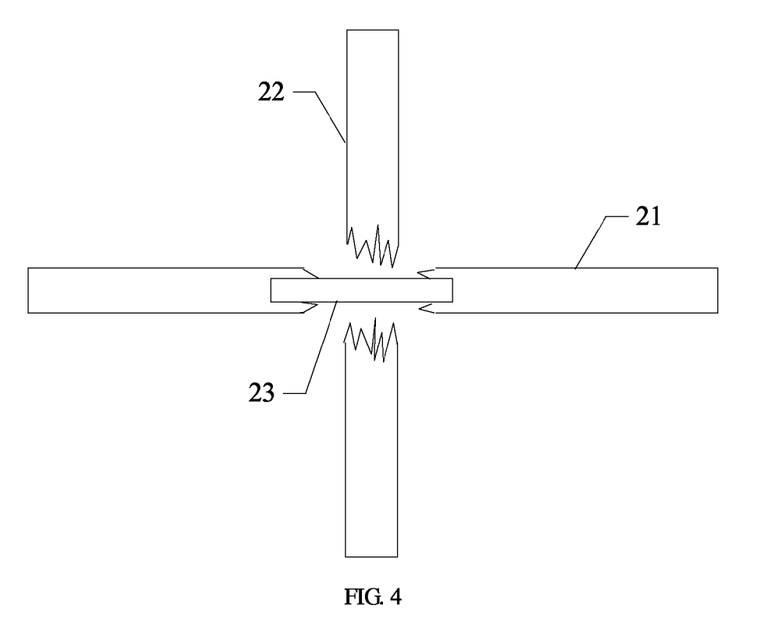
FIG. 4 is a schematic view showing that a first repairing line is coated in accordance with an embodiment of the present disclosure.

Referring also to FIG. 4, there is an impurity at the intersection of a scanning line 21 and a data line 22. Removing the impurity by laser causes the scanning line 21 and the data line 22 to be disconnected at the intersection thereof, or other factors may cause the scanning line 21 and the data line 22 to be disconnected at the intersection thereof, therefore, the scanning line 21 and the data line 22 need to be repaired by thin film coatings. A first repairing line 23 is at first coated and the two ends thereof are respectively connected to two points of the disconnected portion of the scanning line 21, which is capable of conducting the scanning line 21 and repairing the scanning line 21.

Step S12, forming an insulation layer on the first repairing line.

Figure 5:
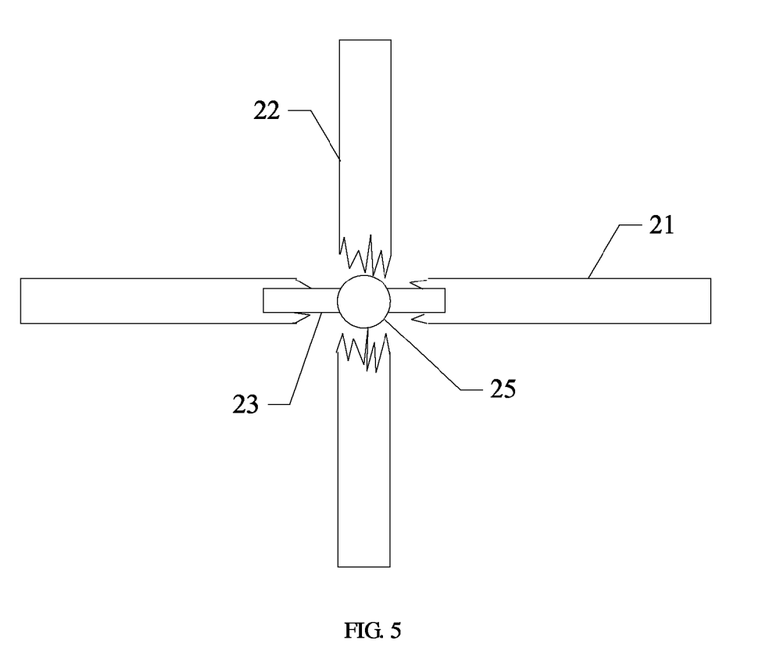
FIG. 5 is a schematic view showing that an insulation layer is coated in accordance with an embodiment of the present disclosure.

After the insulation layer 25 is coated on the first repairing line 23, the insulation layer 25 can cover the whole first repairing line 23, or the insulation layer 25 can partly cover the first repairing line 23, as shown in FIG. 5.

In the step, an insulation film is at first coated and is processed through the processes of photoresist-coating, exposing, etching, photoresist-stripping to form the insulation layer 25 which covers the first repairing line 23. It is noted that in other embodiments, the insulation layer 25 may be coated only on the first repairing line 23 directly.

Step S13, forming a second repairing line with two ends thereof respectively connected to two ends of a disconnected portion of the data line.

Figure 6:
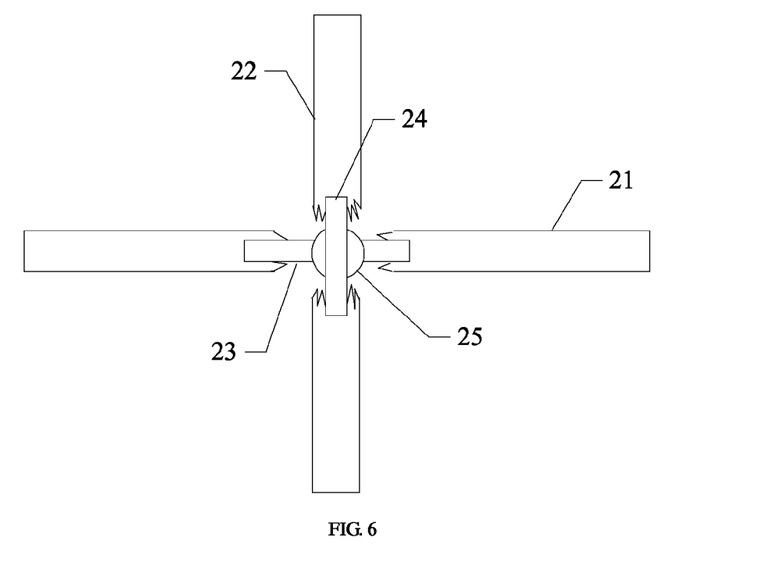
FIG. 6 is a schematic view of a repairing structure for a disconnected defect in accordance with an embodiment of the present disclosure.

Referring also to FIG. 6, the second repairing line 24 is formed and two ends thereof are respectively connected to the two ends of the disconnected portion of the data line 22, which conducts the data line 22 and repairs the data line 22. The insulation layer 25 is located at the intersection of the second repairing line 24 and the first repairing line 23. When the second repairing line 24 is being coated, the second repairing line 24 does not contact the first repairing line 23 due to the insulation layer 25 thereon, which effectively prevents the first repairing line 23 from contacting the second repairing line 24 to generate a short circuit.

In the step S12, if the insulation layer 25 partly covers the first repairing line 23, the intersection of the second repairing line 24 and the first repairing line 23 corresponds to the part of the insulation layer 25 covering the first repairing line 23. It is noted that in the step S12, the position at which the second repairing line 24 is formed can be preset, thus, the intersection of the second repairing line 24 and the first repairing line 23 can be determined according to the preset position of the second repairing line 24, allowing the insulation layer 25 to be formed at the intersection.

By forming an insulation layer 25 between the first repairing line 23 and the second repairing line 24, the present disclosure avoids the short circuit at the intersection of the scanning line 21 and the data line 22 effectively, repairs the disconnected defect at the intersection of two metal layers, and further improves the yield rate of the repairing of the disconnected defect.

Figure 3:
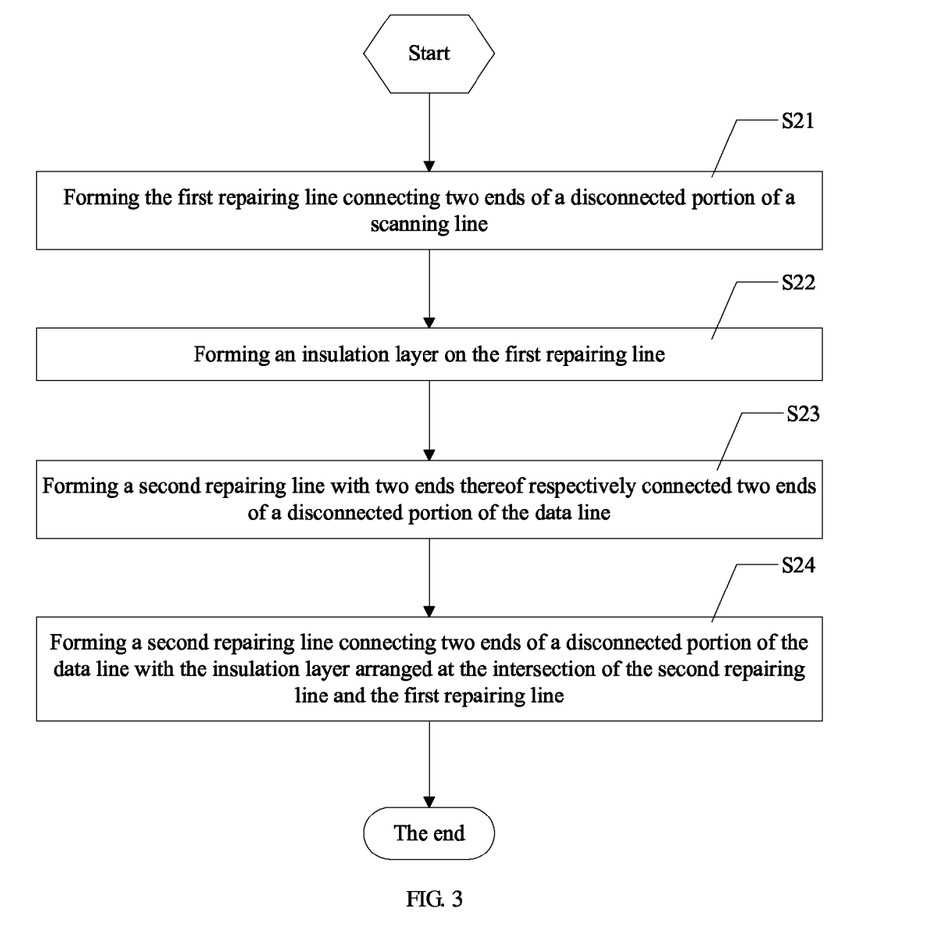
FIG. 3 is a flow chart of a repairing method for a disconnected defect in accordance with another embodiment of the present disclosure.

Referring to FIG. 3, which is a flow chart of a repairing method for a disconnected defect in accordance with another embodiment of the present disclosure. Based on the embodiment shown in FIG. 2, a step of curing the insulation layer is further provided in the embodiment.

Step S21, forming the first repairing line connecting two ends of a disconnected portion of a scanning line.

Step S22, forming an insulation layer covering the first repairing line.

Step S23, curing the insulation layer.

Referring to FIG. 5, after the insulation layer 25 is coated, if the insulation layer 25 is made of material which is formed after being cured, the insulation layer 25 is cured. According to the material of the insulation layer 25, the insulation layer 25 can be cured by baking or exposure to ultraviolet light. The insulation layer 25 can be prevented from falling off in the following manufacturing process after being cured, thereby avoiding the short circuit between the scanning line 21 and the data line 22.

Step S24, forming a second repairing line connecting two ends of a disconnected portion of the data line with the insulation layer arranged at the intersection of the second repairing line and the first repairing line.

In the embodiment, the insulation layer 25 is arranged between the first repairing line 23 and the second repairing line 24, and the insulating layer 25 is cured by baking or by exposure to ultraviolet light, which prevents the insulation layer 25 from falling off in the following manufacturing process, further avoids the short circuit between the first repairing line 23 and the second repairing line 24 at the intersection thereof, and improves the yield rate of the repairing of the disconnected defect.

The present disclosure further provides a repairing structure for a disconnected defect. Referring to FIG. 6, which is a schematic view of the repairing structure for the disconnected defect in accordance with an embodiment of the present disclosure.

By repairing the disconnected defect using the method mentioned in the above embodiments, the repairing structure for the disconnected defect is obtained for repairing disconnected defect at the intersection of the scanning line and the data line on the TFT array substrate. The repairing structure for the disconnected defect includes a first repairing line 23, a second repairing line 24, and an insulation layer 25. The first repairing line 23 is connected to two ends of a disconnected portion of a scanning line 21, the second repairing line 24 is connected to two ends of the a disconnected portion of a data line 22, and the insulation layer 25 is arranged between the first repairing line 23 and the second repairing line 24. The insulation layer 25 can cover the whole first repairing line 23 or the insulation layer 25 can partly cover the first repairing line 23. The insulation layer 25 can be arranged at the intersection of the first repairing line 23 and the second repairing line 24.

By forming an insulation layer 25 between the first repairing line 23 and the second repairing line 24, the present disclosure avoids the short circuit after the scanning line 21 and the data line 22 are repaired, repairs the disconnected defect at the intersection of two metal layers, improves the yield rate of the repairing of the disconnected defect, and reduces manufacturing cost.

Figure 7:
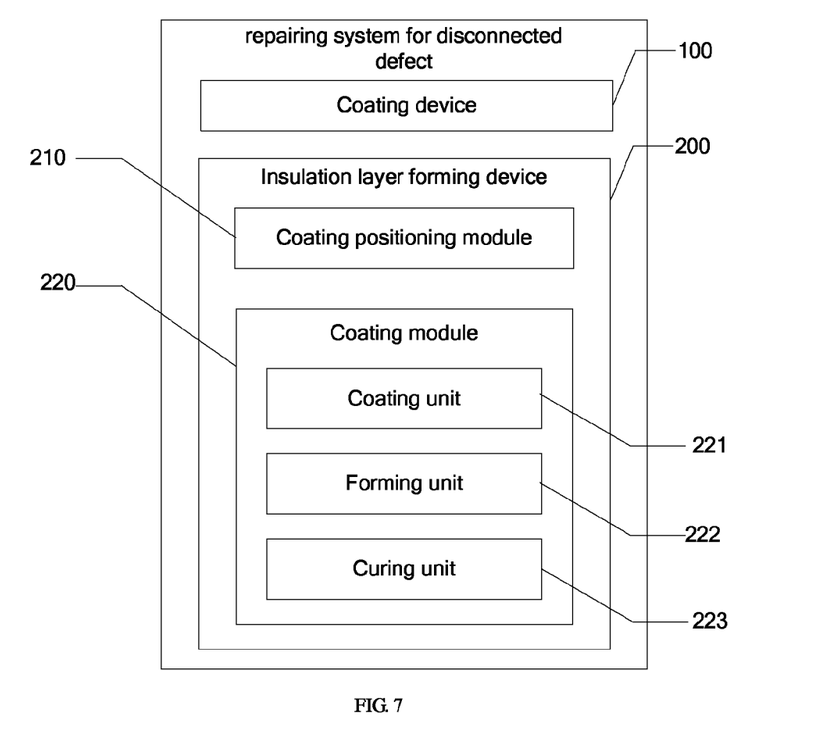
FIG. 7 is a schematic view of a repairing system for a disconnected defect in accordance with an embodiment of the present disclosure.

The present disclosure further provides a repairing system for a disconnected defect. Referring to FIG. 7, which is a schematic view of the repairing system for the disconnected defect in accordance with an embodiment of the present disclosure. The repairing system for the disconnected defect includes a coating device 100 and an insulation layer forming device 200.

The coating device 100 is used for forming a first repairing line connecting two ends of a disconnected portion of a scanning line and a second repairing line connecting two ends of a disconnected portion of a data line.

The insulation layer forming device 200 is used for forming an insulation layer covering the first repairing line. The insulation layer can cover the whole the repairing line or partly cover the repairing line to allow the insulation layer to cover the intersection of the second repairing line and the first repairing line.

The insulation layer forming device 200 specifically includes:

a coating positioning module 210 for presetting a position at which the second repairing line is formed and determining a position of the intersection of the first repairing line and the second repairing line according to the preset position of the second repairing line; and a coating module 220 for forming the insulation layer at the intersection of the first repairing line and the second repairing line with the insulation layer covering the intersection.

The coating module 220 specifically includes:

a coating unit 221 for coating an insulation film; and a forming unit 222 for performing processes of photoresist-coating, exposing, developing, etching, photoresist-stripping to the insulation layer to form the insulation layer.

The coating module 220 can further include a curing unit 223 for curing the insulation layer. The curing unit 223 can be a baker or an ultraviolet irradiator.

The principle of the embodiment can be referred to the embodiments shown in FIGS. 2 to 6, which is not given detail again. The repairing system for the disconnected defect of the embodiment can avoid the short circuit at the intersection of the scanning line and the data line effectively, repairs the disconnected defect at the intersection of two metal layers, and further improves the yield rate of the repairing for the disconnected defect.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A repairing method for a disconnected defect, comprising:
    forming a first repairing line connecting two ends of a disconnected portion of a scanning line;
    forming an insulation layer covering and contacting the first repairing line directly; and forming a second repairing line connecting two ends of a disconnected portion of a data line with the insulation layer located at an intersection of the scanning line and the data line;

wherein the step of forming an insulation layer covering the first repairing line comprises:

coating an insulation film;

performing a photoresist-coating process, an exposing process, a developing process, an etching process, and a photo-stripping process to the insulation film to form the insulation layer.

2. The repairing method as claimed in claim 1, wherein the step of forming an insulation layer covering the first repairing line comprises:

presetting a position at which the second repairing line is formed;

determining a position of an intersection of the first repairing line and the second repairing line according to the position at which the second repairing line is formed; and forming an insulation layer at the intersection of the first repairing line and the second repairing line with the insulation layer covering the intersection.

3. The repairing method as claimed in claim 1 further comprising the following step after the step of forming an insulation layer covering the first repairing line:

curing the insulation layer.

4. The repairing method as claimed in claim 3, wherein the step of curing the insulation layer comprises:

baking the insulation layer or exposing the insulation layer to ultraviolet light.

5. The repairing method as claimed in claim 1, wherein the step of forming an insulation layer covering the first repairing line comprises:

forming the insulation layer covering the whole first repairing line.

6. A repairing structure for a disconnected defect located at an intersection of a scanning line and a data line of a TFT array substrate, comprising:

a first repairing line connecting two ends of a disconnected portion of a scanning line;

a second repairing line connecting two ends of a disconnected portion of a data line; and an insulation layer coated to the first repairing line directly and arranged at an intersection of the first repairing line and the second repairing line;

wherein the insulation layer covers the whole first repairing line.

7. A repairing system for a disconnected defect, comprising:

a coating device for forming a first repairing line connecting two ends of a disconnected portion of a scanning line and a second repairing line connecting two ends of a disconnected portion of a data line; and an insulation layer forming device for forming an insulation layer for covering the first repairing line;

wherein the coating module comprises:

a coating unit for coating an insulation film; and a forming unit for performing a photoresist-coating process, an exposing process, a developing process, an etching process, and a photoresist-stripping process to the insulation film to form the insulation layer.

8. The repairing system as claimed in claim 7, wherein the insulation layer forming device comprises:

a coating positioning module for presetting a position at which the second repairing line is formed and determining a position of an intersection of the first repairing line and the second repairing line according to the preset position at which the second repairing line is formed; and a coating module for forming the insulation layer at the position of the intersection of the first repairing line and the second repairing line with the insulation layer covering the intersection.

9. The repairing system as claimed in claim 8, wherein the coating module further comprises a curing unit for curing the insulation layer.

10. The repairing system as claimed in claim 9, wherein the curing unit is a baker or an ultraviolet irradiator.

11. The repairing system as claimed in claim 7, wherein the insulation layer is used for forming the insulation layer covering the whole first repairing line.

* * * * *